United States Patent
Junker et al.

(10) Patent No.: US 11,681,676 B2
(45) Date of Patent: Jun. 20, 2023

(54) COMPRESSION DETERMINATION FOR COLUMN STORE

(71) Applicant: SAP SE, Walldorf (DE)

(72) Inventors: Frederic Junker, Walldorf (DE); Christian Lemke, Karlsruhe (DE); Sebastian Seifert, Heidelberg (DE)

(73) Assignee: SAP SE, Walldorf (DE)

( * ) Notice: Subject to any disclaimer, the term of this patent is extended or adjusted under 35 U.S.C. 154(b) by 64 days.

(21) Appl. No.: 17/357,097

(22) Filed: Jun. 24, 2021

(65) Prior Publication Data
US 2022/0414078 A1 Dec. 29, 2022

(51) Int. Cl.
*G06F 16/22* (2019.01)
*H03M 7/30* (2006.01)

(52) U.S. Cl.
CPC ........ *G06F 16/221* (2019.01); *G06F 16/2282* (2019.01); *H03M 7/6064* (2013.01)

(58) Field of Classification Search
CPC ............................ G06F 16/221; G06F 16/2282
USPC ........................................................ 707/693
See application file for complete search history.

(56) References Cited

U.S. PATENT DOCUMENTS

| | | | | |
|---|---|---|---|---|
| 10,841,405 | B1* | 11/2020 | Lewis, III | G06F 16/2282 |
| 2009/0248725 | A1* | 10/2009 | Bhattacharjee | H03M 7/30 |
| 2012/0323929 | A1* | 12/2012 | Kimura | G06F 16/2282 |
| | | | | 707/E17.084 |
| 2013/0036101 | A1* | 2/2013 | Marwah | H03M 7/30 |
| | | | | 707/693 |
| 2017/0139947 | A1* | 5/2017 | Abed | G06F 16/221 |
| 2018/0246809 | A1* | 8/2018 | Rebholz | G06F 16/901 |
| 2020/0081993 | A1* | 3/2020 | Rupp | G06F 16/1744 |
| 2021/0216515 | A1* | 7/2021 | Zheng | G06F 16/221 |

FOREIGN PATENT DOCUMENTS

EP 2889787 A2 7/2015

OTHER PUBLICATIONS

"European Search Report" which was dated May 6, 2022 in connection with EP Application No. 21205515.6.

* cited by examiner

Primary Examiner — Muluemebet Gurmu
(74) Attorney, Agent, or Firm — Buckley, Maschoff & Talwalkar LLC

(57) ABSTRACT

A system includes application of respective compression types to first data associated with each of a plurality of columns to generate compressed column data, determination of a first compression ratio for each of the plurality of columns based on the compressed column data, storage of the determined first compression ratios, application, for each of the plurality of columns, of the determined compression type to second data associated with the column to generate second compressed column data, determination of a second compression ratio for each of the plurality of columns based on the second compressed column data, determination of a value for each column based on the stored first compression ratio and the second compression ratio determined for the column, determination of a representative value of the determined values, and determination, based on the representative value, whether to re-determine a compression type for each of the plurality of columns.

19 Claims, 7 Drawing Sheets

COMPRESSION DETERMINATION FOR COLUMN STORE

BACKGROUND

Conventional database systems store large amounts of data in the form of database tables. To conserve memory, the data of a database table may be stored in a compressed format. In some implementations, the particular compression algorithm used to compress data of a database table is determined upon creation of the database table. However, as the data of the table grows in size and/or the distribution of the data values thereof changes, the originally-determined compression algorithm might no longer be suited to the table (e.g., may no longer provide a suitable trade-off between performance/CPU load and compression ratio), resulting in increased memory consumption and performance degradation.

Some database systems periodically re-determine the compression algorithms to be applied to stored table data, and re-compress the stored data based on any newly-determined compression algorithms. In the case of a columnarly-stored database table, respective compression algorithms may be periodically re-determined for each column of the table. Compression algorithms suitable for columnar data include but are not limited to Run-Length Encoding (RLE), prefix encoding, cluster encoding, indirect encoding and sparse encoding.

The resource cost of simple periodic re-determination of the most appropriate compression algorithm may outweigh the benefits of any resulting improvements in compression. In prior systems, re-determination of compression algorithms may be triggered manually or based on a determination that the number of rows in the table which have changed since a last determination has exceeded a particular threshold (e.g., a particular number, a percentage of the original number of table rows). The number of rows was therefore used as a proxy to estimate whether re-evaluation of the choice of compression algorithm would provide a net benefit.

Triggering the re-determination of compression algorithms based on the number of changed rows may result in sub-optimal decisions as to when to re-determine the most appropriate compression algorithm. On the one hand, the compression ratio of a table may deteriorate even though the number of changed rows does not increase significantly over time. For example, in the case of a columnar data store, compression ratios of individual columnar data may deteriorate even in the absence of a large number of changed rows. Conversely, in a case that the number of changed rows of a table increases significantly but the overall compression ratio of the table has not, unnecessary re-determination of compression algorithms may be triggered, thereby wasting considerable resources.

What is needed are improved systems to efficiently trigger the re-determination of compression algorithms to be applied to stored table data.

DETAILED DESCRIPTION

The following description is provided to enable any person in the art to make and use the described embodiments. Various modifications, however, will remain readily-apparent to those in the art.

Generally, some embodiments calculate and store a compression ratio for each column of a table during initial compression of the columns of the table. At each delta merge, a new compression ratio for each column is calculated and difference between the new and stored compression ratio for each column is determined. The maximum difference of these differences is then used as a parameter to determine whether to trigger re-determination of a suitable compression algorithm for each column. The parameter is not limited to a maximum difference of compression ratios, and may comprise any other representative value determined based on the new and stored compression ratios of each column.

A delta merge operation requires loading of each table column into memory. Accordingly, determination of the current compression ratio is less expensive from a performance/CPU standpoint during a delta merge than at other points of runtime.

In some embodiments, the compression algorithms are re-determined if the maximum difference is above a first threshold or if the number of changed rows since the last re-determination is above a second threshold. Some embodiments may consider both the maximum difference and the number of changed rows. For example, the compression algorithms may be re-determined if the maximum difference is above a first threshold and the number of changed rows since a last re-determination is above a second threshold, or if the sum of X*the maximum difference and Y*the number of changed rows is greater than a predefined number, where X and Y are given weights. Parameters other than or in addition to the number of changed rows may be considered in some embodiments.

Figure 1:
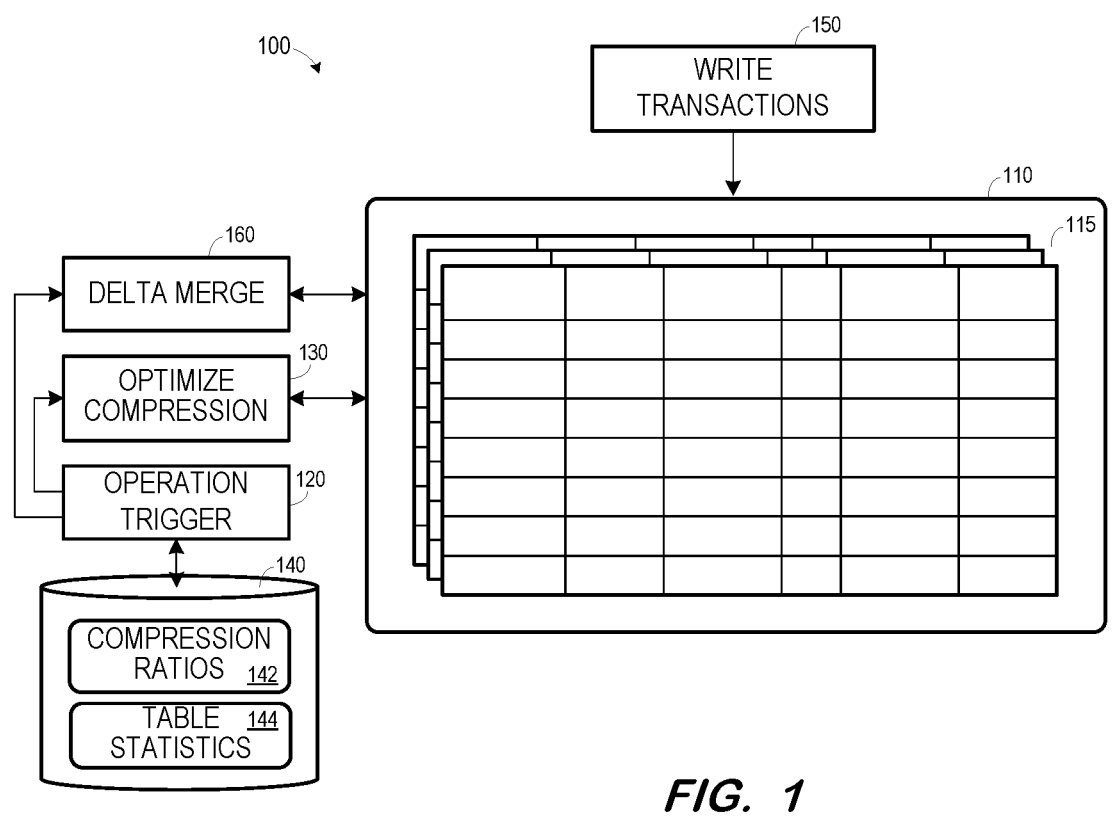
FIG. 1 is a logical block diagram of a system to optimize compression of columnar database table data at runtime according to some embodiments.

FIG. 1 is a logical block diagram of system 100 according to some embodiments. The illustrated elements of system 100 may be implemented using any suitable combination of computing hardware and/or software that is or becomes known. In some embodiments, two or more elements of system 100 are implemented by a single computing device. One or more elements of system 100 may be implemented by an on-premise system and/or using cloud-based resources.

Data store 110 stores database tables 115. Data store 110 may comprise a columnar data store in which the data of each column of each of database tables 115 is stored in contiguous memory addresses as is known in the art. Moreover, each column of each of database tables 115 is compressed within data store 110 using a compression algorithm which is determined by optimize compression component 130 according to some embodiments.

For example, upon the initial loading of data into a table 115, operation trigger component 120 instructs optimize compression component 130 to determine a suitable compression algorithm for each column of the table 115 as is known in the art. The determined compression algorithm, or compression type, may comprise RLE, prefix encoding, cluster encoding, sparse encoding or any other suitable compression type.

Optimize compression component 130 then applies, to the data of each column, the compression algorithm determined for the column. As will be described below, the column data to which the compression algorithm is applied may be already dictionary-encoded and bit-compressed. For clarity, this dictionary-encoded and bit-compressed data will be considered "uncompressed". Optimize compression component 130 determines a compression ratio for each compressed column, for example by dividing the size of the uncompressed column by the size of the compressed column. Since each column is loaded into volatile memory in order to perform the compression, determination of the compression ratio is less resource-intensive than otherwise. The compression ratio determined for each column is stored in compression ratios 142 of metadata store 140.

During operation of system 100, write transactions 150 issue commands such as but not limited to Data Manipulation Language (DML) statements (e.g., insert, delete, update) which change the data of database tables 115. As will be described below, such changes to a database table 115 are captured by delta column fragments associated with each column of the database table 115.

At some point during operation, operation trigger component 120 determines, based on table statistics 144 (e.g., a count of changed rows of a given table) and as is known in the art, that the delta column fragments associated with a table 115 should be merged into the main column fragments associated with the table 115. Accordingly, operation trigger component 120 instructs delta merge component 160 to perform the merge operation, resulting in a new set of main column fragments for the table 115. In this regard, the compression described herein is applied to the set of main column fragments for a given table 115, and not to the delta column fragments (which are dictionary-encoded and bit-compressed as described above).

A delta merge operation may change the distribution and order of data in the subject database table. Typically, the compression ratio of a table (e.g., the size of all the main column fragments of the table prior to compression/the size of all the main column fragments of the table after compression) deteriorates after every delta merge operation, resulting in increased memory consumption and slower scan/query performance since more data has to be processed.

According to some embodiments, after a delta merge operation is performed on a database table 115, operation trigger component 120 calculates a new compression ratio for each column of the table and computes a difference between the new compression ratio and stored compression ratio 142 for each column. Calculation of the new compression ratios is facilitated by the fact that each column of the table is loaded into volatile memory during the delta merge operation. The maximum difference in compression ratio is stored in association with an identifier of the table 115 in compression ratios 142 (or, for example, in table statistics 144).

Operation trigger component 120 may periodically determine whether to instruct optimize compression component 130 to re-determine a compression algorithm for each column of a given table. To make this determination, operation trigger component 120 may retrieve the stored maximum compression ratio difference associated with the table from metadata store 140 and use the stored maximum difference used as a parameter of a cost function. The cost function may simply compare the stored maximum difference to a threshold, and operation trigger component 120 instructs optimize compression component 130 to re-determine a compression algorithm for each column if the stored maximum difference exceeds the threshold.

Several delta merge operations may be performed on a table prior to re-determining the compression algorithms for the columns of the table. The maximum compression ratio difference for the table is re-determined and re-stored (e.g., overwritten) as described above after each delta merge operation. Determination of whether to instruct optimize compression component 130 to re-determine the compression algorithms for a table may proceed independently of any delta merge operations performed on the table, and will based on the currently-stored maximum compression ratio difference associated with the table.

Figure 2:
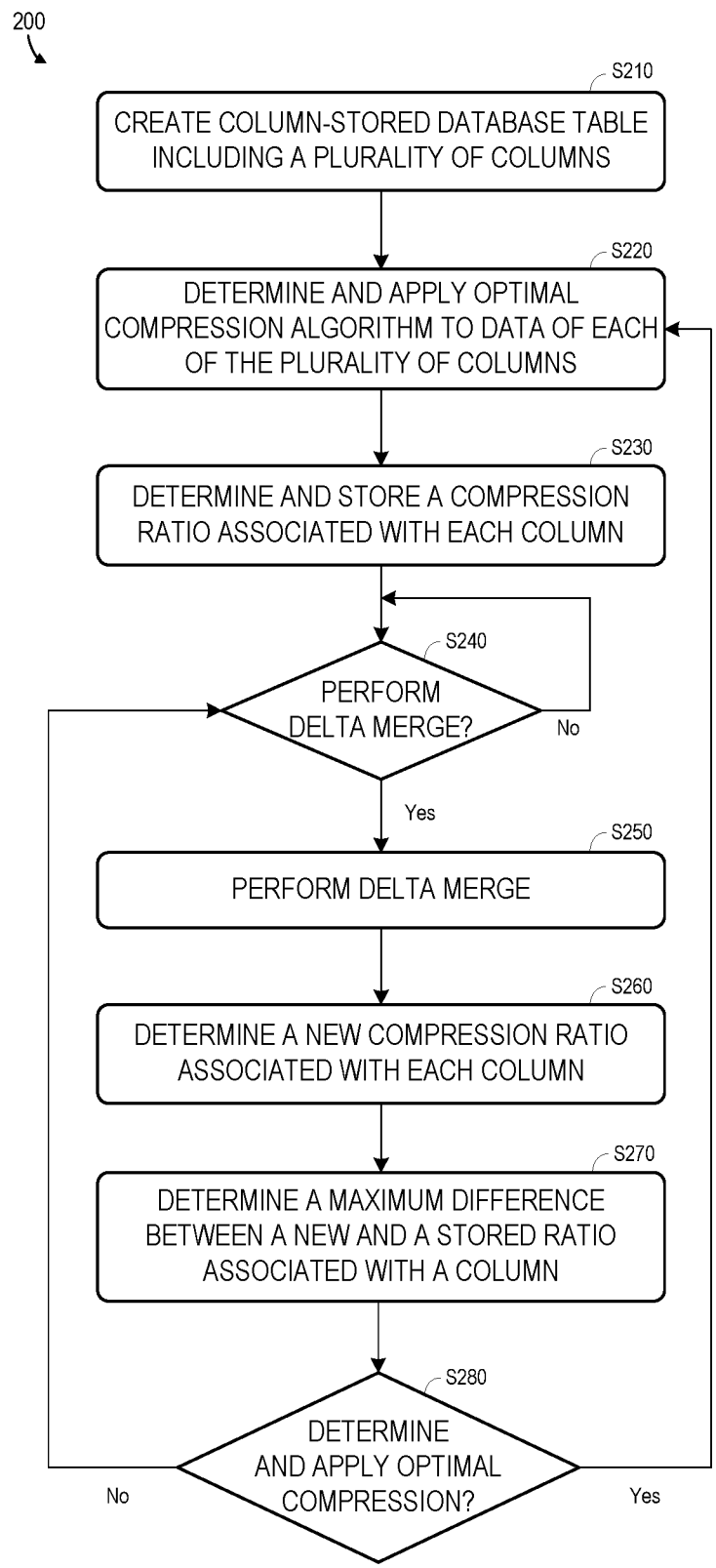
FIG. 2 comprises a flow diagram of a process to optimize compression of columnar database table data at runtime according to some embodiments.

FIG. 2 comprises a flow diagram of process 200 to optimize compression of columnar database table data at runtime according to some embodiments. In some embodiments, various hardware elements execute program code to perform process 200. Process 200 and other processes described herein may be executed by a database system using any suitable combination of hardware and software. Software program code embodying these processes may be stored by any non-transitory tangible medium, including a fixed disk, a volatile or non-volatile random-access memory, a DVD, a Flash drive, and a magnetic tape, and executed by any suitable processing unit, including but not limited to one or more programmable microprocessors, microcontrollers, processing cores, and processor threads. Embodiments are not limited to the examples described below.

Initially, a database table is created at S210. The database table includes a plurality of columns and is designated as a column-stored table as is known in the art. Accordingly, the data of a given column of the table is stored in contiguous memory locations (i.e., row0, row1, row2, . . . ) as described below. The data may also be dictionary-encoded and bit-compressed as also described below. The created database table includes one main column fragment for each column of the database table.

The database table may be created at S210 in response to a received Data Description Language (DDL) statement as is known in the art. Such a DDL statement may be received from a client application operated by a user or a database administrator, or from any other suitable source. Creation of the database table at S210 may comprise populating two or more rows of the database table so that compression may be applied thereto.

Dictionary encoding and bit compression will now be described. Each record of a database table includes several values, one for each column of the table. The amount of memory required to store these values may be reduced by storing value IDs instead of the values themselves. In order to facilitate such storage, a dictionary is used which maps values into value IDs. Each unique value in the dictionary is associated with one unique value ID. Therefore, when a particular value is to be stored in a database record, the value ID for the value is determined from the dictionary and the value ID is stored in the record instead. To quickly determine rows containing a dictionary value, a secondary structure, or dictionary index, may be used. The dictionary index may be, for example, a hash map or tree-based map from value to value ID.

Figures 3A, 3B:
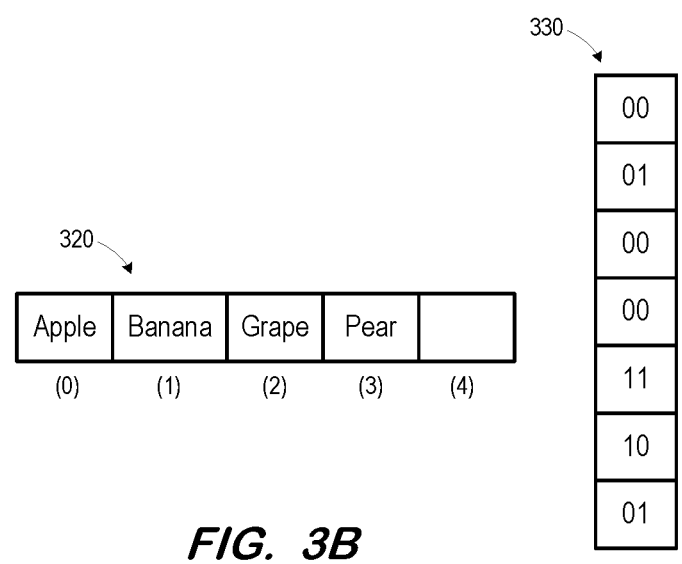
FIG. 3A illustrates a database table according to some embodiments.
FIG. 3B illustrates a data dictionary and a column vector according to some embodiments.

FIG. 3A illustrates table 310 according to some embodiments. Table 310 includes four columns, each of which includes various values. Dictionary 320 of FIG. 3B is associated with column 315 and is used for encoding the values of column 315. Dictionary 320 is sorted alphabetically and re-sorted each time a previously-absent value is added to column 315 and therefore to dictionary 320. Each other column is also associated with a respective (unshown) dictionary. Each vector element at position i of dictionary 320 stores the value associated with value ID i. That is, value "Pear" is associated with value ID 1, value "Banana" is associated with value ID 1, etc.

Vector 330 represents the rows of column 315 after being encoded based on dictionary 320 and bit-compressed. In this regard, since dictionary 320 includes only four values, only two binary bits are needed to encode the values. Accordingly, each occurrence of value "Apple" in column 315 has been replaced by value ID 00 in vector 330, each occurrence of value "Banana" has been replaced by value ID 01, each occurrence of value "Grape" has been replaced by value ID 10, and each occurrence of value "Pear" has been replaced by value ID 11. If column 315 included a fifth value (e.g., "Watermelon", in an unshown row), then three binary bits would be needed to encode the values of dictionary 320 and vector 330 would read 000, 001, 000, 000, 011, 010 and 001 Storage of the values of vector 330 requires less storage space than storage of the values of column 315, and the stored values of vector 330 are more amenable to compression.

A sorted dictionary is suitable for storage of columnar data (e.g., since it supports direct binary search and does not require the overhead of a dictionary index) and for reading of columnar data (e.g., since range queries are executed directly on integer value encodings, rather than actual domain's value lookup). Conversely, a sorted dictionary is not ideal for inserting new values into columnar data (e.g., since new values do not arrive in order and the dictionary would therefore require constant re-sorting).

Figure 4:
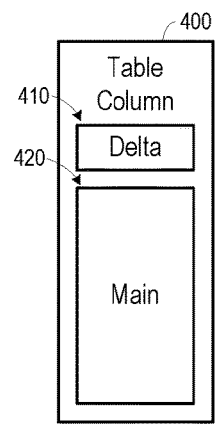
FIG. 4 illustrates a column store delta fragment and a column store main fragment of a database table column according to some embodiments.

Each table column in a columnar data store may be logically split into a delta column fragment and a main column fragment. FIG. 4 illustrates delta column fragment 410 and main column fragment 420 associated with table column 400 according to some embodiments. Delta column fragment 410 may be optimized for read and write access in disk and in memory, while main column fragment 420 may be optimized for read access in disk and in memory.

According to some embodiments, a main column fragment contains all the data within an associated table column, and is stored using a sorted dictionary (i.e., dictionary-encoded) and bit compression. The encoded and bit-compressed data of a main column fragment may also be subjected to advanced compression determined by an optimize compression component as described herein. A delta column fragment contains newly-written data which has not yet been merged into the main fragment, and is stored using a non-sorted dictionary and bit compression. All new data is inserted into the delta column fragments, and the data of the main column fragments changes only during delta merges and other data reorganization processes.

Large tables may be physically partitioned (e.g., by hash, by range, etc.). For a table composed of m columns and n partitions, each column is associated with n main column fragments and n delta column fragments. Accordingly, the table is associated with m x n main column fragments and m x n delta column fragments.

As described above, new main column fragments are created by delta merge operations according to some embodiments. For example, all delta column fragments for a table may be merged into their associated main column fragments if it is determined that the delta column fragments have reached (or are about to reach) a predetermined total threshold size. The threshold size may be statically or dynamically-configured, and may be table and/or partition-specific. The delta merge process is non-blocking to readers and writers, except for two short time windows at either end of the process.

Figure 5:
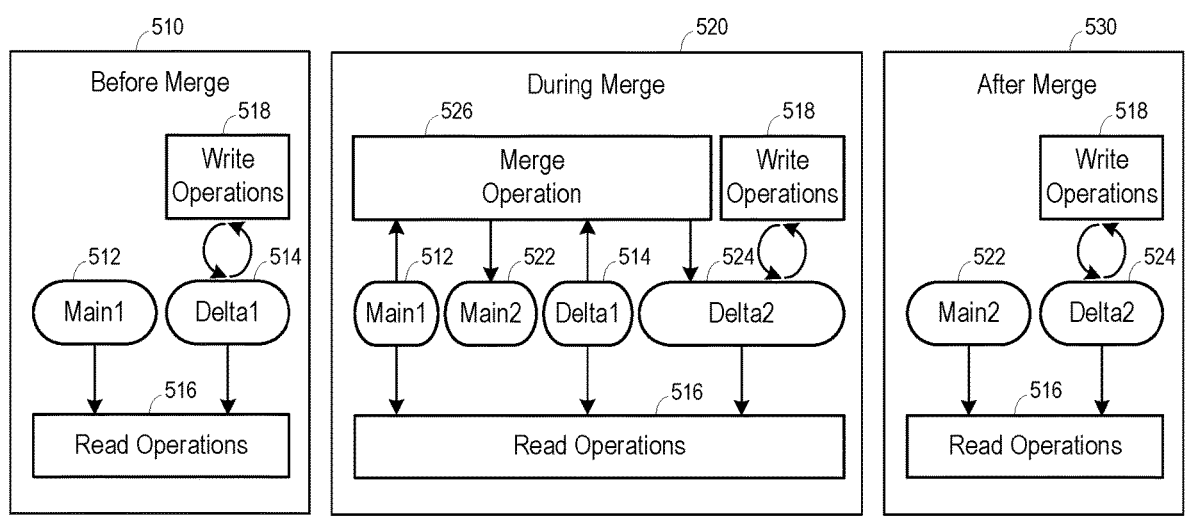
FIG. 5 illustrates a delta merge operation according to some embodiments.

During a delta merge of a table, a main column fragment and a new delta column fragment are created for each column of the table. FIG. 5 illustrates the delta merge process for a particular column according to some embodiments. Box 510 illustrates runtime operation prior to the delta merge. As shown, main column fragment 512 and delta column fragment 514 each serve incoming read operations 516, and write operations 518 are served by delta column fragment 514.

Box 520 illustrates the merge process according to some embodiments. Merge operation 526 creates new empty delta column fragment 524 and directs write operations 518 thereto. Merge operation 526 also reads main column fragment 512 and delta column fragment 514 and creates new main column fragment 522 based thereon. Read operations 516 are served during this time by main column fragment 512, delta column fragment 514, and delta column fragment 524.

Upon success of the merge, as illustrated in box 530, main column fragment 512 and delta column fragment 514 are dropped. New delta column fragment 524 contains only rows inserted during the merge. New main column fragment 522 contains the data from main column fragment 512 and delta column fragment 514. If the delta merge is determined to have failed, the system reverts to main column fragment 512 and delta column fragment 514.

Received DDL statements may result in creation of a new column, dropping of an existing column, or alteration of an existing column. New main and delta column fragments are created for any new columns, and main and delta column fragments associated with any dropped columns are logically deleted. For certain DDL statements that alter an existing column (e.g., changes to the data type of a column), new associated main and delta column fragments are created. For other DDL statements that alter an existing column (e.g., specification of a new default value for the column on inserts to the table), the delta and main column fragments associated with the column might not change.

Returning to process 200, an optimal compression algorithm is determined for each of the plurality of columns of the created database table at S220. S220 assumes that at least one delta merge has been run on the table, since determination of an optimal compression algorithm requires a main column fragment and no main column fragment exists if no delta merge has been run. Any suitable systems for determining an optimal compression algorithm for a set of data may be utilized at S220. "Optimal" and "optimize" are used herein to merely indicate a compression algorithm which is suitable and/or preferable for the given scenario in which process 200 is deployed. The determined compression algorithm for a given column may include RLE, prefix encoding, cluster encoding, sparse encoding, or any other suitable algorithm including no compression. The compression algorithm determined for each column is then applied to the data (i.e., to the main column fragment) of each column.

A compression ratio is determined for each column at S230. The compression ratio determined for each column is then stored for later access. In some embodiments, any compression ratios between 0 and 1.5 are mapped to an 8-bit value between 1 and 255, and all ratios larger than 1.5 are considered 'large' and mapped to 255. These 8-bit values, rather than the actual compression ratios, are stored at S230.

In some embodiments, the compression ratio for a column is determined by dividing the size of the compressed column (i.e., after S220) by the size of the uncompressed column (i.e., prior to S220). Alternatively, S230 may comprise determination of any suitable proxy value associated with the compression ratio. For example, the compression ratio may be determined at S230 as (size in bytes of main column fragment*8 bits per byte)/(number of rows*ceil($\log_2$(number of distinct values in the column))).

Flow pauses at S240 until it is determined to perform a delta merge. As described above, a delta merge may be triggered if the number of changed rows of the table exceeds a threshold, if a size of all the delta column fragments of the table exceeds a threshold size, or based on any other factor or combination of factors. Once it is determined (e.g., by operation trigger component 120) at S240 to perform a delta merge, a delta merge is performed at S250. The delta merge merges the delta column fragment of each column of the database table with its corresponding main column fragment to create a new main column fragments for each column of the table.

After the delta merge at S250, a new compression ratio is determined for each column of the table at S260. The new compression ratios are determined based on the new main column fragments generated by the delta merge, each of which is currently compressed using a previously-determined compression algorithm. The compression ratios may be determined as described above with respect to S230 to allow direct comparison of the stored and new compression ratios.

A maximum difference between a new and a stored compression ratio associated with a column is determined at S270. This maximum difference is the maximum of differences of compression ratios across all columns of a given database table. For example, for each column, a difference between a stored compression ratio associated with the column and a newly-determined compression ratio for the column is determined. The maximum of all these determined differences is identified at S270 and stored.

The value determined at S270 may comprise a maximum quotient of compressed data size to uncompressed data size. S270 may comprise calculation of any value which is based on the original compression ratio and the post-delta merge compression ratio of each column.

At S280, it is determined whether to re-determine a compression algorithm for each column and to apply the re-determined compression algorithms to the data of the columns. This determination is based on the maximum difference determined at S270, and may also be based on other parameters, statistics or values. If it is determined to re-determine and apply compression algorithms, flow returns to S220 and continues as described above.

Flow returns to S240 and pauses as described above if the determination at S280 is negative. Accordingly, after a next delta merge, S260 and S270 are re-executed to determine another maximum difference between newly-determined compression ratios and the stored compression ratios for each column. It should be noted that the column associated with the maximum difference may change during successive iterations of S260 and S270. That is, a first column of the table may be associated with the maximum compression ratio difference after a delta merge and, after a next delta merge, another column of the table may be associated with the maximum compression ratio difference.

According to some embodiments, the maximum difference is stored at S270 and flow returns from S270 directly to S250. Process 200 in such embodiments controls performance of the delta merges and the determinations of a current maximum compression ratio difference, but a separate parallel process is responsible for determining whether to re-determine the compression algorithms and apply the re-determined compression algorithms to the data of the columns based on a currently-stored maximum compression ratio difference.

Figure 6:
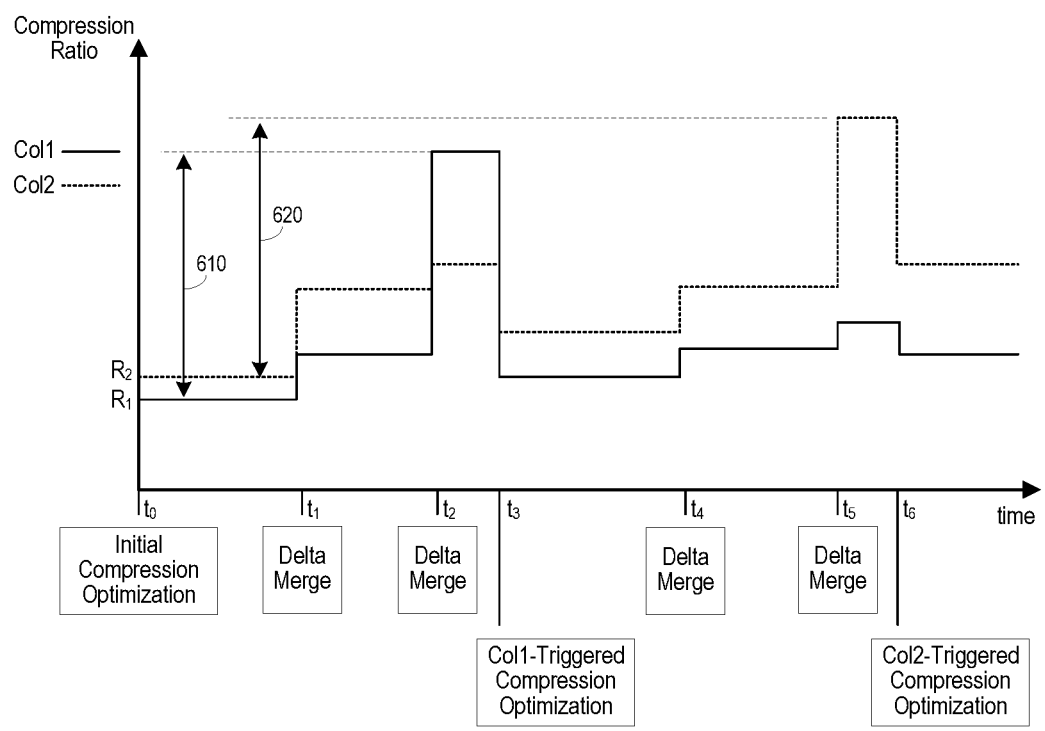
FIG. 6 illustrates compression ratios of two database table columns over time according to some embodiments.

FIG. 6 is a graph of compression ratio vs. time for two columns Col1 and Col2 (i.e., two main column fragments) of a database table according to some embodiments. The database table may include columns in addition to Col1 and Col2. It is assumed that the table is created at $t_0$, at which point a compression algorithm is determined for each column and the determined compression algorithms are applied to the columns. Respective compression ratios $R_1$ and $R_2$ are then determined for each of compressed columns Col1 and Col2, and stored as described above.

A delta merge operation occurs at $t_1$ to merge the delta column fragment of Col1 with the main column fragment of Col1 and to merge the delta column fragment of Col2 with the main column fragment of Col2. The compression ratios associated with each new main column fragment increase from prior compression ratios $R_1$ and $R_2$. In this regard, the FIG. 6 compression ratios are determined such that the uncompressed size is associated with the denominator of the ratio and the compressed size is associated with the numerator. Accordingly, the compression ratios are less than 1.

The difference between the new compression ratio of Col2 and original compression ratio $R_2$ is greater than the difference between the new compression ratio of Col1 and original compression ratio $R_1$. It will be assumed that difference between the new compression ratio of Col2 and original compression ratio $R_2$ is the maximum compression ratio difference of any column of the table. This maximum difference may be stored and used to determine whether to trigger compression optimization.

A delta merge operation occurs again at $t_2$. This operation again merges the current delta column fragment of Col1 with the last-generated main column fragment of Col1 and merges the current delta column fragment of Col2 with the last-generated main column fragment of Col2. The compression ratios associated with each new main column fragment again increase, and the difference between the new compression ratio of Col1 and original compression ratio $R_1$ (i.e., difference 610) is greater than the difference between the new compression ratio of Col2 and original compression ratio $R_2$. It will be assumed that difference 610 is the maximum compression ratio difference of any column of the table.

Based on difference 610 (e.g., because difference 610 is greater than a threshold), it is then determined at $t_3$ to trigger compression optimization. Accordingly, a compression algorithm is determined for each column of the table and the determined compression algorithms are applied to the columns at $t_3$. Consequently (but not necessarily), the compression ratios associated with the main column fragments of Col1 and Col2 $t_3$ are less than that calculated at $t_2$, indicating increased compression of these columns.

Although this optimization at $t_3$ is labeled Col1-Triggered Compression Optimization, it should be noted that the particular column associated with the current maximum difference may be unknown during the determination to trigger compression optimization.

A delta merge operation occurs again at $t_4$, resulting in a new main column fragment of Col1 and a new main column fragment of Col2, both of which are compressed according to the compression algorithms determined for each column at $t_3$. The compression ratios associated with each new main column fragment are determined and shown as increased in FIG. 6. The difference between the new compression ratio of Col2 and original compression ratio $R_2$ is greater than the difference between the new compression ratio of Col1 and original compression ratio $R_1$. The difference between the new compression ratio of Col2 and original compression ratio $R_2$ is stored.

At $t_5$, a delta merge operation again merges the current delta column fragment of Col1 with the last-generated main column fragment of Col1 and merges the current delta column fragment of Col2 with the last-generated main column fragment of Col2. The compression ratios associated with each new main column fragment again increase, and the difference between the new compression ratio of Col2 and the original compression ratio $R_2$ (i.e., difference 620) is determined to be greater than the difference between the new compression ratio of Col1 (or of any other column) and the original compression ratio $R_1$ (or the compression ratio of any other column).

It will be assumed that difference 620 is greater than a threshold, resulting in a determination at $t_6$ to trigger compression optimization. A compression algorithm is therefore determined for each column of the table and the determined compression algorithms are applied to the columns at $t_6$. FIG. 6 illustrates resulting decreases in the compression ratios associated with Col1 and Col2.

Figure 7:
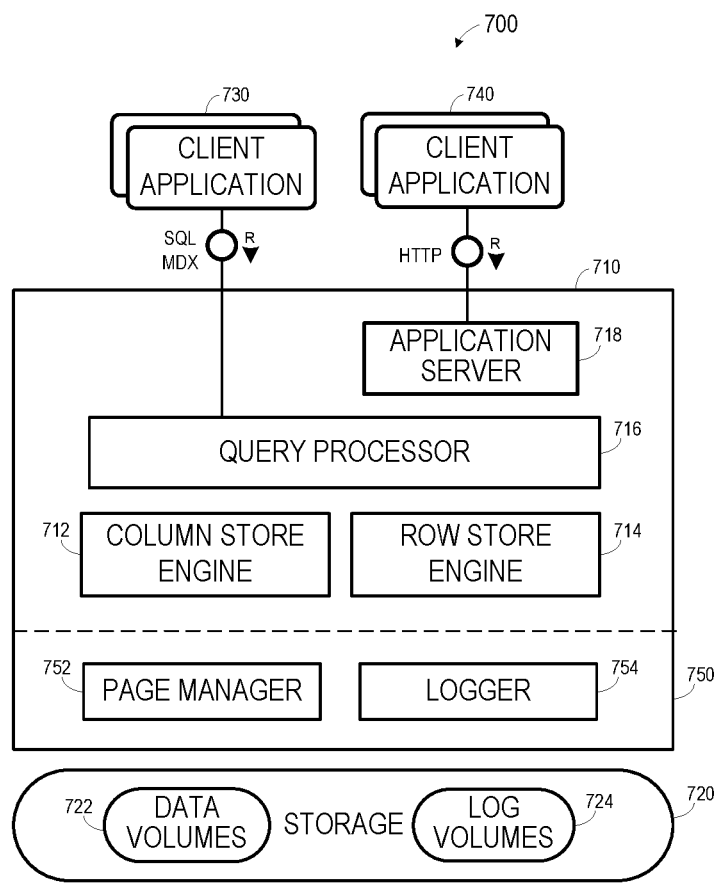
FIG. 7 is a block diagram of a database architecture according to some embodiments.

FIG. 7 is a block diagram of an implementation of database architecture 700 according to some embodiments. Embodiments are not limited to the illustrated elements of FIG. 7. The illustrated elements may be implemented by any suitable combinations of hardware and software as is known in the art. Such combinations may include one or more programmable processors (microprocessors, central processing units, microprocessor cores, execution threads), one or more non-transitory storage media, and processor-executable program code.

Database system 710 may comprise any query-responsive database system that is or becomes known, including but not limited to a structured-query language (i.e., SQL) relational database management system. Database system 710 may comprise an "in-memory" database, in which Random Access Memory is used as a cache and for storing the full database during operation.

Database system 710 includes column store engine 712. Column store engine 712 manages tabular data of a database as is known in the art. Column store engine 712 may implement the processes described herein upon columnar tables, including a delta merge operation, an optimize compression operation, and an operation trigger operation. Data managed by column store engine 712 or by row store engine 714 may be retrieved or modified in response to requests received from query processor 716. Query processor 716, in turn, may receive queries received from applications executing on application server 718 and in communication with client applications 740, or directly from client applications 730.

According to some embodiments, column store engine 712 includes in-memory representations of delta column fragments and main column fragments. According to some embodiments, new main column fragments are constructed by column store engine 712, persisted to data volumes 722 of storage 720, and read therefrom by column store engine 712.

Persistence layer 750 include page manager 752 to control storage 720 (e.g., a disk-based filesystem) for writing to and reading from data volumes 722 and log volumes 724 stored thereon. Storage 720 may comprise one or more non-volatile data storage units (e.g., fixed disks) storing relational data, multi-dimensional data, or any other structured and/or unstructured data.

Although system 710 reflects a "single node" database system, embodiments may also be implemented within one or more nodes of a distributed database, each of which comprises an executing process, a cache and a datastore. The data stored in the datastores of each node, taken together, represent the full database, and the database server processes of each node operate to transparently provide the data of the full database to the aforementioned database applications. System 710 may also or alternatively support multi-tenancy by providing multiple logical database systems which are programmatically isolated from one another.

Figure 8:
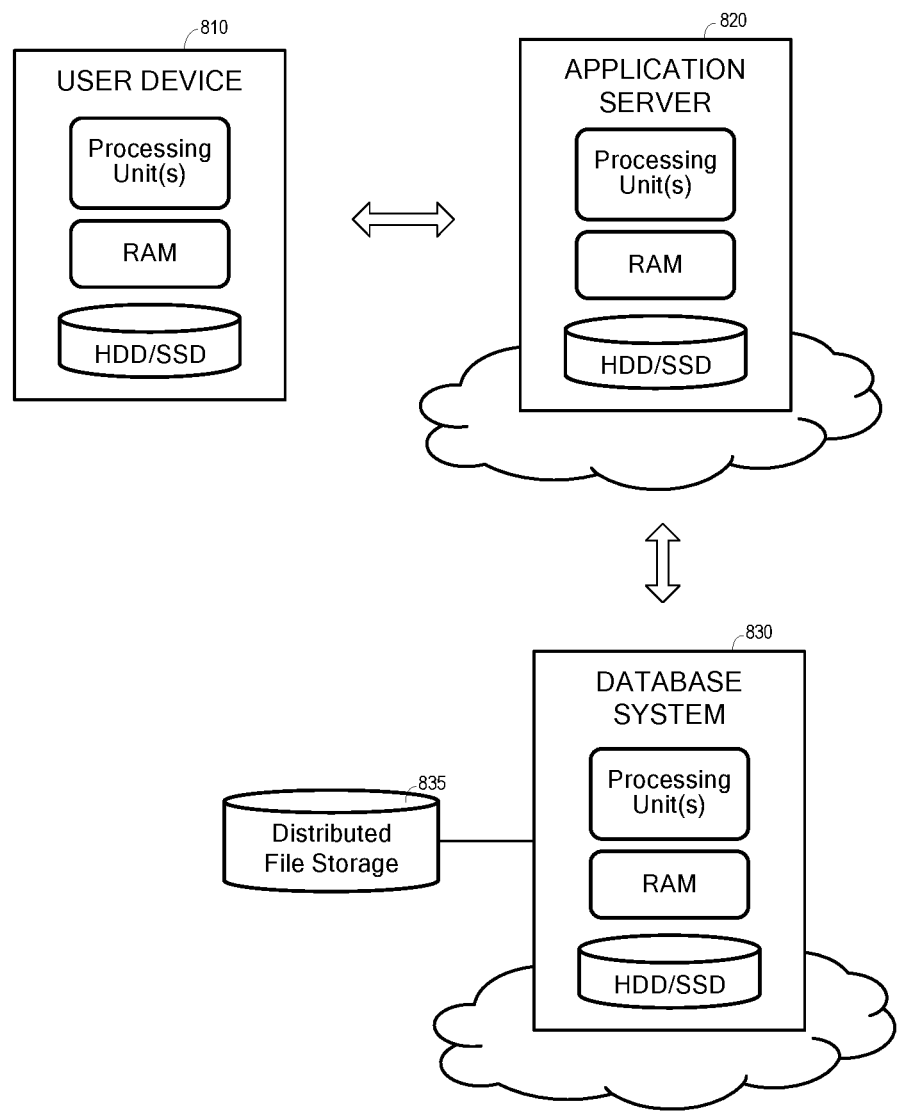
FIG. 8 is a block diagram of a cloud-based database architecture according to some embodiments.

FIG. 8 illustrates a cloud-based database deployment according to some embodiments. The illustrated components may reside in one or more public clouds providing self-service and immediate provisioning, autoscaling, security, compliance and identity management features.

User device 810 may interact with applications executing on application server 820, for example via a Web Browser executing on user device 810, in order to create, read, update and delete data managed by database system 830 and persisted in distributed file storage 835. Database system 830 may store data in columnar fashion as described herein and may execute process as described herein to trigger compression optimization of such columnar data. Application server 820 and/or database system 830 may comprise cloud-based compute resources, such as virtual machines, allocated by a public cloud provider. As such, application server 820 and database system 830 may exhibit demand-based elasticity.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of system 100 may include a programmable processor to execute program code such that the computing device operates as described herein.

All systems and processes discussed herein may be embodied in program code stored on one or more non-transitory computer-readable media. Such media may include, for example, a DVD-ROM, a Flash drive, magnetic tape, and solid state Random Access Memory (RAM) or Read Only Memory (ROM) storage units. Embodiments are therefore not limited to any specific combination of hardware and software.

Elements described herein as communicating with one another are directly or indirectly capable of communicating over any number of different systems for transferring data, including but not limited to shared memory communication, a local area network, a wide area network, a telephone network, a cellular network, a fiber-optic network, a satellite network, an infrared network, a radio frequency network, and any other type of network that may be used to transmit information between devices. Moreover, communication between systems may proceed over any one or more transmission protocols that are or become known, such as Asynchronous Transfer Mode (ATM), Internet Protocol (IP), Hypertext Transfer Protocol (HTTP) and Wireless Application Protocol (WAP).

Embodiments described herein are solely for the purpose of illustration. Those in the art will recognize other embodiments may be practiced with modifications and alterations to that described above.

What is claimed is:

1. A system comprising:
    at least one programmable processor; and
    a non-transitory machine-readable medium storing program code that, when executed by the at least one programmable processor, cause the at least one programmable processor to perform operations comprising:
        determine a first compression type for each of a plurality of columns of a database table, where a first compression type determined for a first one of the plurality of columns is different from a first compression type determined for a second one of the plurality of columns;
        for each of the plurality of columns, apply the first compression type determined for the column to first data associated with the column to generate compressed column data;
        determine a first compression ratio for each of the plurality of columns based on the compressed column data;
        store the determined first compression ratios;
        for each of the plurality of columns, apply the first compression type determined for the column to second data associated with the column to generate second compressed column data;
        for each of the plurality of columns, determine a second compression ratio based on the second compressed column data;
        for each of the plurality of columns, determine a value based on the stored first compression ratio and the second compression ratio determined for the column;
        determine a representative value of the determined values;
        determine, based on the representative value, to re-determine a second compression type for each of the plurality of columns; and
        re-determine the second respective compression type for each of the plurality of columns, wherein the first compression type determined for the first one of the plurality of columns is different from the second compression type re-determined for the first one of the plurality of columns.

2. A system according to claim 1, wherein the second data associated with each of the plurality of columns is generated by merging, for each column, an associated delta column fragment with associated first data.

3. A system according to claim 1, wherein the value determined for each column is a difference between the stored first compression ratio and the second compression ratio determined for the column.

4. A system according to claim 1, wherein the value determined for each column is a quotient of the stored first compression ratio and the second compression ratio determined for the column.

5. A system according to claim 1, wherein determination of the first compression ratio comprises determination of a size of the first data, a number of rows of the first data and ceil(log2(a number of distinct values in the first data)).

6. A system according to claim 1, the program code to cause the at least one programmable processor to perform operations comprising:
    for each of the plurality of columns, apply a third compression type to third data associated with the column to generate third compressed column data;
    determine a third compression ratio for each of the plurality of columns based on the third compressed column data;
    determine a second value for each column based on the stored first compression ratio and the third compression ratio determined for the column;
    determine a second representative value of the determined second values; and
    determine whether to re-determine a fourth compression type for each of the plurality of columns based on the second representative value.

7. A system according to claim 1, wherein determination to re-determine a second compression type for each of the plurality of columns of a database table is based on the representative value and on a number of rows of the database table changed since a prior determination of compression types.

8. A computer-implemented method, comprising:
    for each of a plurality of columns of a database table, applying a respective first compression type to first data associated with the column to generate compressed column data, where a respective first compression type for a first one of the plurality of columns is different from a respective first compression type for a second one of the plurality of columns;
    for each of the plurality of columns, determining a first compression ratio based on the compressed column data;
    storing the determined first compression ratios;
    for each of the plurality of columns, applying the respective first compression type of the column to second data associated with the column to generate second compressed column data;
    for each of the plurality of columns, determining a second compression ratio based on the second compressed column data;
    for each of the plurality of columns, determining a value based on the stored first compression ratio and the second compression ratio determined for the column;
    determining a representative value of the determined values;
    determining, based on the representative value, to re-determine a second respective compression type for each of the plurality of columns; and
    re-determining the second respective compression type for each of the plurality of columns, wherein the respective first compression type determined for the first one of the plurality of columns is different from the respective second compression type re-determined for the first one of the plurality of columns.

9. A method according to claim 8, wherein the second data associated with each of the plurality of columns is generated by merging, for each column, an associated delta column fragment with associated first data.

10. A method according to claim 8, wherein the value determined for each column is a difference between the stored first compression ratio and the second compression ratio determined for the column.

11. A method according to claim 8, wherein the value determined for each column is a quotient of the stored first compression ratio and the second compression ratio determined for the column.

12. A method according to claim 8, wherein determining the first compression ratio comprises determination of a size of the first data, a number of rows of the first data and ceil(log2(a number of distinct values in the first data)).

13. A method according to claim 8, further comprising:
for each of the plurality of columns, applying the second respective compression type to third data associated with the column to generate third compressed column data;
determining a third compression ratio for each of the plurality of columns based on the third compressed column data;
determining a second value for each of the plurality of columns based on the stored first compression ratio and the third compression ratio determined for the column;
determining a second representative value of the determined second values;
determining, based on the second representative value, to determine a third respective compression type for each of the plurality of columns; and
determining the third respective compression type for each of the plurality of columns.

14. A method according to claim 8, wherein determining to re-determine a second respective compression type for each of the plurality of columns is based on the representative value and on a number of rows of the database table changed since a prior determination of compression types.

15. A non-transitory computer-readable medium storing program code, the program code executable by a computing system to cause to the computing system to:
determine a first compression type for each of a plurality of columns of a database table, where a first compression type determined for a first one of the plurality of columns is different from a first compression type determined for a second one of the plurality of columns;
for each of the plurality of columns, apply the first compression type determined for the column to first data associated with the column to generate compressed column data;
for each of the plurality of columns, determine a first compression ratio based on the compressed column data;
store the determined first compression ratios;
for each of the plurality of columns, apply the first compression type determined for the column to second data associated with the column to generate second compressed column data;
determine a second compression ratio for each of the plurality of columns based on the second compressed column data;
determine a value for each of the plurality of columns based on the stored first compression ratio and the second compression ratio determined for the column;
determine a representative value of the determined values;
determine, based on the representative value, to re-determine a second compression type for each of the plurality of columns; and
re-determine the second respective compression type for each of the plurality of columns, wherein the first compression type determined for the first one of the plurality of columns is different from the second compression type re-determined for the first one of the plurality of columns.

16. A medium according to claim 15, wherein the second data associated with each of the plurality of columns is generated by merging, for each column, an associated delta column fragment with associated first data.

17. A medium according to claim 15, wherein the value determined for each column is a difference between the stored first compression ratio and the second compression ratio determined for the column.

18. A medium according to claim 15, wherein the value determined for each column is a quotient of the stored first compression ratio and the second compression ratio determined for the column.

19. A medium according to claim 15, wherein determination of the first compression ratio comprises determination of a size of the first data, a number of rows of the first data and ceil(log2(a number of distinct values in the first data)).

* * * * *